United States Patent [19]

Lee et al.

[11] Patent Number: 5,153,102
[45] Date of Patent: Oct. 6, 1992

[54] ALKALLINE-SOLUTION-DEVELOPABLE LIQUID PHOTOGRAPHIC COMPOSITION

[75] Inventors: Rong-Jer Lee, Yun-Lin; Chein-Dhau Lee, Hsinchu; Wen-Shin Shen, Hwa-Lien; Dhei-Jhai Lin, Taoyuan, all of Taiwan

[73] Assignee: Industrial Technology Research Institute, Hsinchu, Taiwan

[21] Appl. No.: 565,946

[22] Filed: Aug. 10, 1990

[51] Int. Cl.$^5$ .................. G03F 7/28; G03F 7/033; G03F 7/035
[52] U.S. Cl. ........................ 430/284; 430/285; 430/287; 430/906; 430/909; 430/910; 522/117; 522/121; 522/94
[58] Field of Search ............... 430/284, 285, 287, 906, 430/909, 910; 522/117, 121, 94

[56] References Cited

U.S. PATENT DOCUMENTS

| | | | |
|---|---|---|---|
| 3,899,611 | 8/1975 | Hall | 522/94 X |
| 4,140,605 | 2/1979 | Sano et al. | 522/121 X |
| 4,438,189 | 3/1984 | Geissler et al. | 430/905 X |
| 4,572,887 | 2/1986 | Geissler | 430/288 |
| 4,587,199 | 5/1986 | Bennett | 430/273 X |
| 4,806,450 | 2/1989 | Hofmann et al. | 430/287 X |
| 4,920,037 | 4/1990 | Takahashi et al. | 430/284 X |

*Primary Examiner*—Cynthia Hamilton
*Attorney, Agent, or Firm*—Scully, Scott, Murphy & Presser

[57] ABSTRACT

An alkaline-solution-developable liquid image-producing composition useful as a permanent protective layer for printed circuit boards is disclosed comprising at least: (1) an acrylic copolymer with hyroxy group, carboxyl group and branched unsaturated carbon double bond. Its number average molecular weight is 3,000 to 10,000 and its acid value is at least 30 mg KOH/g; (2) a photo reactive monomer with hydroxy group, the number of the unsaturated carbon double bond functional groups should be not less than 2; (3) a melamine compound; and (4) a free radical photo initiator.

9 Claims, No Drawings

5,153,102

ALKALLINE-SOLUTION-DEVELOPABLE LIQUID PHOTOGRAPHIC COMPOSITION

BACKGROUND OF THE INVENTION

The present invention relates to an alkaline solution developable liquid image-producing composition useful as a permanent protective layer for printed circuit boards i.e., a solder mask.

Solder mask is used as a covering layer on a printed circuit board for preventing short circuiting during the soldering process, protecting the metallic wires from corrosion, and maintaining good electrical insulation. The performance of a solder mask is determined by its heat resistance, solvent resistance and adhesiveness. These properties are generally determined as follows: A test plate coated with the solder mask is dipped into a molten tin-lead solder at 240°–280° C. for 10 seconds and then into dichloromethane for 2 minutes. An adhesiveness test is then carried out with a No. 600 adhesive tape available from 3M corporation, USA. Although peeling of the antisoldering layer may be observed, qualified solder masks should not show in any trace of peeling under such test.

To meet the standards for finer and closer wire lines on the printed circuit boards, photographic film-forming solder mask has been developed. Such solder mask is a photopolymerizable composition which can be polymerized by irradiation with light of a specific wavelength range. If a mask covers the composition, the non-irradiated areas of the composition will not polymerize and therefore can be subsequently removed by dissolving with a solvent or an alkaline solution. An image of polymerized antisoldering layer is then obtained. The image can then be further irradiated with ultraviolet light or heated to about 150° C. to give a stronger protective layer.

Photographic solder masks can be classified into dry film and liquid types. European Patent Application No. EP 0 115 354 discloses a dry film type solder mask in which a photopolymerizable composition is inserted between a polyester film and a polyvinyl ester film. When the film is utilized, the polyvinyl film is removed and the remaining layer is pressed onto a printed circuit board. The disadvantage of the film is that poor adherence is obtained between the wired lines. Worse results are frequently found when the gap between wire lines is below 8 mil.

Liquid photographic solder mask, on the contrary, possesses superior adhesiveness due to its better flowability and wettability to the substrate.

Photographic solder mask can be developed with solvent. However, the utilization of solvent causes environmental problems and solvent recovery further adds to the cost.

Aqueous alkaline solutions such as 1% aqueous $Na_2CO_3$ solution, have also been used for developing photographic solder mask. If the aqueous alkaline solution is used in combination with photographic solder mask having a solid content higher than 70 wt%, environmental pollution problems can be significantly alleviated.

Conventionally, an alkaline solution developable solder mask is composed of an acid group containing straight chain polymeric binder, photo- or heat-sensitive crosslinkable monomers and a photoinitiator. Similar solder masks have been disclosed in, for example, European Patent Application No. EP 0 115 354 and Japanese Laid-Open Patent Application No. Sho 62-160440. The acidic binder does not participate in the photo-sensitive or heat-sensitive crosslinking reaction, and thus although the composition may be developed with weak alkaline solution, the resultant crosslinked film after baking at higher temperature cannot resist the corrosion of strong alkaline solution, such as 5% NaOH. The other properties such as solvent resistance (e.g. against $CH_2Cl_2$), thermal resistance and impact strength are also inferior. The shortcomings of the properties are caused by high solubility of the acidic binder and the weak crosslinked structure of the small molecular weight monomer.

SUMMARY OF THE INVENTION

Therefore, it is an object of the present invention to provide an alkaline solution developable liquid image-producing composition which can be used on printed circuit board as a permanent protective layer.

Yet another object of the present invention is to provide an alkaline solution developable liquid image-producing composition which use protects the metallic wires from corrosion.

Still another object of the present invention is to provide a alkaline solution developable liquid image-producing composition with good electrical properties, resistance to high temperature and resistance to solvent.

These and other objects, advantages and features of the present invention will be more fully understood and appreciated by reference to the written specification.

DETAILED DESCRIPTION OF THE INVENTION

The present invention relates to an alkaline solution developable liquid image-producing composition useful as a permanent protective layer for printed circuit board. i.e., a solder mask, which comprises a) from 20 to 80 percent by weight of an acrylic copolymer consisting essentially of hydroxyl-containing units, carboxyl-containing units and pendant unsaturated double bond-containing units, where the number average molecular weight of said copolymer is from 3,000 to 100,000, the acid value of said copolymer is at least 30 mg KOH/g, said hydroxyl-containing units constitute from 3 to 15 percent by mole of said copolymer, said carboxyl-containing units constitute from 5 to 45 percent by mole of said copolymer and said pendant unsaturated double bond-containing units constitute from 5 to 40 percent by mole of said copolymer;

b) from 5 to 40 percent by weight of a hydroxyl-containing photoreactive monomer which contains at least 2 double bonds;

c) from 5 to 30 percent by weight of a melamine compound; and d) from 0.5 to 12 percent by weight of a free radical photoinitiator.

In accordance with the present invention, the composition relates to an alkali solution developable photopolymerization composition comprising at least:

(1) an acrylic copolymer with hydroxy group, carboxyl group and branched unsaturated carbon double bond. Its number average molecular weight is 3,000 to 100,000 and its acid value is at least 30 mg KOH/g;

(2) a photo reactive monomer with hydroxy group, the number of the unsaturated carbon double bond functional groups should be not less than 2;

(3) a melamine compound; and (4) a free radical photo initiator.

By application of the composition of this composition according to the present invention, a protective film with good electrical properties, good resistance to high temperature and good resistance to solvent can be obtained, which is particularly suitable for use in printed circuit boards as an anti-soldering agent.

One of the characteristics of the composition of this invention is the high number of cross-linking functional groups. Hence, the degree of cross-linking of the coated film is very high and renders it good heat and solvent-resistant.

There are two stages in the synthesis of a copolymer with hydroxy, carboxyl and branched unsaturated carbon double bonds. Firstly, it is the synthesis of a linear acrylic polymer and then the attachment of the branched unsaturated double bonds to the polymer. In the polymerization of the linear acrylic polymer, the polymer comprises the following monomers:

(a) acrylic monomers with hydroxy groups, with a mole percentage of 0.05 to 0.3;

(b) acrylic monomers with carboxyl groups, with a mole percentage of 0.05 to 0.6; and (c) acrylic monomers, with a mole percentage of 0.2 to 0.6.

In accordance with the present invention, the polymerization is conducted in a suitable solvent, and an initiator is used to initiate the reaction. The molecular weight of the resultant polymer is from about 3,000 to about 100,000 and its acid value is above 50 mg KOH/g. The structure of the resultant linear polymer is shown below:

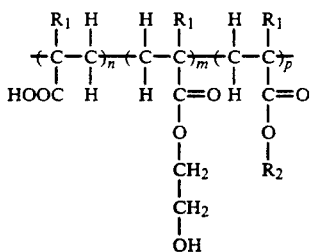

wherein $R_1 = H, CH_3$; $R_2 = C_rH_{2r+1}$, $r = 1$ to 18, n, m, and p are integers.

The above (a) acrylic monomers with hydroxy groups is selected from the group consisting of hydroxyethyl methacrylate, hydroxyethyl acrylate, or acrylic monomers of the formula

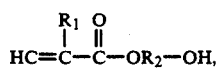

wherein $R_1$ is H or $CH_3$, $R_2$ is alkyl, alicyl, polyethylene glycol, polypropylene glycol, and aryl groups.

The above (b) acrylic monomer with carboxyl groups is selected from the group consisting of acrylic acid, methacrylic acid, 2-methylene succinic acid.

The above (c) acrylic monomer is selected from alkyl acrylate monomers or alkyl methacrylate monomers, wherein the carbon atom number of the alkyl group is 1 to 18. Other acrylates such as phenyl acrylate, 2-phenylethyl acrylate, 3-phenylpropyl acrylate, 2-cyclohexylethyl acrylate, benzyl acrylate, benzyl methacrylate, phenyl methacrylate 2-phenylethyl methacrylate, 3-phenylpropyl methacrylate, 2-cyclohexylethyl methacrylate, acrylaonitrile, styrene, methyl styrene and the like can be used.

The grafting reaction between the branched unsaturated double bond and the linear acrylic polymer is one of the reactions shown below:

(i) substitution reaction between a compound having the formula of 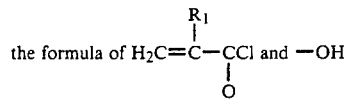 and —OH on the linear copolymer;

(ii) condensation reaction between compounds having the formula of

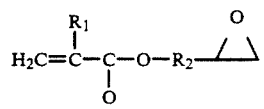

and the —COOH on the linear copolymer;

(iii) condensation reaction between compounds having the formula

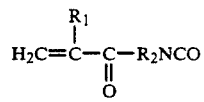

and the —OH or COOH on the linear copolymer.

In the above (i), (ii), (iii) reaction, $R_1$ is H or —$CH_3$, and $R_2$ should be a group involving no grafting reaction, for instance, it can be selected from the group consisting of alkyl, alkoxy, alicyclic, and aryl groups. The number of moles of mono functional acrylate or methacrylate should be less than the mole number of the functional groups of —COOH or —OH. At the completion of the reaction, the mole number of —OH groups contained in the resultant grafted product should, in principle, occupy 3–15 percent of the mole number of the repeated units in the main chain, while the mole number of —COOH group should occupy 5–40 percent of the mole number of the repeated units in the main chain. The amount of the grafted polymer is about 20–80 percent by weight of the composition, preferably, about 40–60% by weight.

In the above (ii) reaction, the number of the unsaturated carbon double bond functional groups in the photoreactive monomer with hydroxy group should not be less than 2. Useful photoreactive monomer is selected from the group consisting of pentaerythritol tiracrylate, dipentaerythritol hydroxypentacrylate, bis-(acryloxyethyl) hydroxethyl isocyanurate, pentaerythritol diacrylate, pentaerythritol dimethacrylate, pentaecythritol-trimethacrylate, the amount of which employed is about 5–40 wt% of the composition.

In accordance with the composition of the present invention, the appropriate melamine compound is primarily hexa(methoxymethyl)-melamine, wherein the methoxy group can be partly or wholly be substituted by a hydroxy group or alkoxy group, and the carbon atom number of the alkoxy group can be 2 to 4. The amount of the melamine compound employed is about 5–30 wt% of the composition.

Free radical initiator suitable for the composition of this invention is selected from the group consisting of diphenyl ketone, dimethoxy-2-phenylacetophenone, 4,4'-dimethylamine diphenylketone, 2-chlorothioxanthone, 2-hydroxy-2-methyl-1-phenyl propane-1-one, 1-hydroxycyclohexyl phenylketone, etc. The amount of the free radical initiators employed is about 0.5-12 wt%. Other free radical initiators such as the derivatives of benzoin, benzoin alkyl ethers, benzil ketals, and acetylbenzene can also be used in the composition of this invention.

Besides the components mentioned above, suitable amounts of solvent or additives such as plasticizer, pigment, filler, thixotropic agent, fire retardant, defoaming agent and wetting agent can be added. Nonreactive solvent such as ketones, ethers, esters, and alcohols can be employed in this composition. Additionally, hydrocarbons and halogenated hydrocarbons can also be employed. Typically, the employed solvent can be selected from the group consisting of acetone, butanone, cyclohexanone, diethoxy ethane, diethylene glycol diethyl ether, 1.,4-dioxane, ethylene diacetate, isobutyl acetate, 2-ethoxyethyl acetate, 2-butoxyethyl acetate, ethoxyethoxyethyl acetate, 2-butoxyethanol, ethoxyethoxyethanol, pentanol, cyclohexane, naphtha, toulene, xylene, chlorobenzene, dichlorobenzene, etc.

In accordance with the present invention, the defoaming agents can be FC430, FC431, which are available from 3M corporation, USA, or Modaflow, available from Monsanto Co., USA. In addition, BYK-020, or BYK141 from BYK Co., can also be added to the composition in a desirable amounts.

The method of coating the composition of this invention may be net-printing, roller-printing, screen printing, or it can be coated by scraping plate or scraping knife.

The invention will be more clearly understood by reference to the following examples. All parts and percentages are by weight unless otherwise indicated.

EXAMPLES

Example 1

In a stirred 30-liter reactor vessel with a heating jacket, the temperature was controlled at 70° C. and the following components were added sequentially over five hours:

| Methacrylic acid | 2322 g |
|---|---|
| Methyl methacrylate | 2820 g |
| Ethylhydroxyl methacrylate | 624 g |
| 2,2'-Azo-di(isobutyl acrylonitrile) | 84 g |
| 2-Butoxy ethanol | 2200 g |
| Glycol diacetate | 3200 g |
| Naphtha | 800 g |
| n-Dodecanthiol | 200 g |

The temperature was maintained with continued stirring for a further 3 hours. The temperature was then elevated to 90° C. and maintained for 4 hours. A binder solution was thus obtained. The following components were then added to the binder solution and reacted for 7 hours:

| Hydroquinone | 12 g |
|---|---|
| Tetra-n-butyl-ammonium chloride | 40 g |
| Glycidyl methacrylate | 2988 g |

A photopolymerizable copolymer was thereafter obtained. The number average molecular weight was about 5600 and the acid value was about 80 mg KOH/g.

Example 2

In a stirred 500-ml reactor vessel, the temperature of the vessel was controlled at 45° C. and the following components were added:

| Toluene 2,4-diisocyanate | 34.83 g |
|---|---|
| Dibutyl stannic di-laurate | 0.331 g |
| 2-(2-ethoxy ethoxy) ethyl acetate | 10 g |

27.3 g of ethyl hydroxyl methacrylate was then added over 2 hours into the reaction mixture. The reaction mixture was then further stirred for 2 hours and a prepolymer (A) was obtained.

In a stirred 1-liter reactor vessel the following components over added sequentially over 5 hours:

| Methacrylic acid | 29.3 g |
|---|---|
| Methyl methacrylate | 25.0 g |
| Butyl acrylate | 37 g |
| Ethyl hydroxyl methacrylate | 15.6 g |
| 2,2'-azo-di(isobutyl acrylonitrile)-Butyrolactone | 94.7 g |
| Methyl ethyl ketone | 157 g |
| n-Dodecanthiol | 0.2 g |

The reaction was then continued for 3 hours at 66° C. 36.71 g of prepolymer (A) was then added and reaction was continued for a further 3 hours, giving a photopolymerizable acrylic copolymer.

Example 3

In this Example, an alkaline liquid photographic composition was employed. The composition possesses excellent heat resistance.

| Binder solution of Example 1 | 215 g |
|---|---|
| Dimethoxy 2-phenylacetophenone | 12 g |
| Pentaerythritol triacrylate | 36 g |
| Hexamethoxymethyl melamine | 15 g |
| Defoaming agent | 4 g |
| 2-butoxyethanol | 12 g |
| No. 7 green pigment | 4 g |

After the above components were mixed, the mixture was ground with a three roller mill until all the particles of the mixture were less than 10 microns. The composition was screen-printed on a 0.75mm FR-4 base plate using 110 mesh silk screen and then processed according to the following procedure:

(1) heating the mixture at a temperature of 80° C. for 20 to 40 min. to remove solvent from the plate so that the coated plate is non-tacky;

(2) contacting the circuit base plate with the mask, making a 600 mJ/cm$^2$ exposure, the radiation source employed has an output of 3KW, 5KW or 7KW;

(3) using about 1% sodium carbonate aqueous solution for developing, liquid pressure at 1 to 2 Kgw/cm$^2$, developing will be completed in 60 to 120 sec; and (4) postbaking at 140° to 150° C. for 40 to 60 min and thus obtaining a permanent protective coating.

In the above compositions, Stoufer 21 scale photosensitive test film was employed. It was exposed under 600 mJ/cm$^2$ After developing, 10 grids was left, the composition is very high photosensitive.

The FR-4 base plate coated with the composition of this invention was cut into 3×10 cm test samples after it had been baked at a high temperature. The sample was then subjected to the following tests:

(i) Alkaline Resistance Test

A sample was dipped into a 5% NaOH aqueous solution at 50° C. The sample was taken out from the solution after soaking for 5 minutes. It was then rinsed with water at ambient temperature, dried, and No. 600 adhesive tape available from 3M Co., USA was used to adhere on it. No evidence of peeling was observed.

(ii) Dichloromethane Solvent Test

Sample wetted by solder-aid was dipped in molten tin-lead bath at 260° C. for 10 sec. The sample was taken out of the bath and rinsed with water (40° C.) to clean off the residual solder aid. After the sample was dried, it was dipped into dichloromethane for 2 min., then taken out and again dried. No. 600 tape (available from 3M) was adhered on the sample. No evidence of peeling was observed.

(3) Heat Impact Test

Sample was baked at 120° C. for 10 min, immediately dipped into liquid nitrogen for 10 sec, and then taken out therefrom. This procedure was repeated twice. The test sample showed no signs of peeling or any other changes.

In conclusion, the composition in accordance with the present invention has excellent heat and alkali resistance.

Example 4

| polymer solution of Example 2 | 200 g |
| dimethoxy 2-phenyl acetophenone | 8 g |
| dipentaerythritol pentacrylate | 40 g |
| hexamethoxymethyl melamine | 20 g |
| barium sulfate | 10 g |
| methyl ethyl ketone | 20 g |
| green pigment No. 7 | 4 g |

The above components were mixed to prepare a composition. A scraper was used to coat the above composition onto a 0.1 mm FR-4 base plate. The coated film was about 30 μm. The procedures of Example 3. Exposure were carried out, and exposure was made at 600 mJ/cm$^2$. The alkali resistance test, solvent resistance. test, and heat impact test of Example 3 were used. The electrical insulation resistance was up to above $10^9$ ohms and the pencil hardness was above 4H.

COMPARATIVE EXAMPLE

Carboset XL 27 of B.F. Goodrich Co. was used as the binder in this comparative example. The copolymer was acrylate copolymer. The acid value was about 80 mg KOH/g and the molecular weight was 40,000.

| Carboset XL27 | 100 g |
| dimethoxy 2-phenyl acetophenone | 10 g |
| pentaerythritol triacrylate | 36 g |
| hexamethoxymethyl melamine | 15 g |
| methyethylketone | 50 g |
| green pigment No. 7 | 4 g |

The above components were mixed to prepare a composition. A scraper was used to coat the above composition onto a 0.1 mm FR-4 base plate. The coated film was about 30 μm. The sample was treated in accordance with the procedure of Example 3. The above tests were conducted after the sample was baked at a high temperature. It was found that there was evidence of severe peeling in the alkali and solvent resistance tests and evidence of severe cracking in the heat impact test.

The invention being thus described, it will be obvious that the same may be varied in many ways. Such variations are not to be regarded as a departure from the spirit and scope of the invention and all such modifications are intended to be included within the scope of the following claims.

We claim:

1. A photopolymerizable composition which, after being exposed imagewise, can be developed with an aqueous alkaline solution, said composition comprising:
    a) from 20 to 80 percent by weight of a linear acrylic copolymer consisting essentially of hydroxyl-containing units, carboxyl-containing units and pendant unsaturated double bond-containing units, where the number average molecular weight of said copolymer is from 3,000 to 100,000, the acid value of said copolymer is at least 30 mg KOH/g, said hydroxyl-containing units constitute from 3 to 15 percent by mole of said copolymer, said carboxyl-containing units constitute from 5 to 45 percent by mole of said copolymer and said pendant unsaturated double bond-containing units constitute from 5 to 40 percent by mole of said copolymer;
    b) from 5 to 40 percent by weight of a hydroxyl-containing photoreactive monomer which contains at least 2 double bonds;
    c) from 5 to 30 percent by weight of a melamine compound; and
    d) from 0.5 to 12 percent by weight of a free radical photoinitiator.

2. A photopolymerizable composition according to claim 1, wherein said hydroxyl-containing photoreactive monomer is selected from the group consisting of pentaerythrite triacrylate, dipentaerythrite hydroxyl penta-acrylate, pentaerythrite diacrylate, quaternary pentaerythrite dimethacrylate, pentaerythrite trimethyl acrylate, bis(acryloxyethyl) hydroxy ethyl isocyanurate and any mixture thereof.

3. A photopolymerizable composition according to claim 1, wherein said melamine compound is hexamethoxymethyl melamine in which the methoxy contains from 2 to 4 carbon atoms and can partly or wholly be substituted by hydroxyl or alkoxyl.

4. A photopolymerizable composition according to claim 1, wherein said photoinitiator is selected from the group consisting of benzoin, benzoin alkyl ether, benzil ketals, acetophenone, dimethoxy-2-phenyl acetophenone, diphenyl ketone, 4,4′-dimethylamine diphenylketone, 2-chlorothioxanthone, and 1-hydroxycyclohexyl phenylketone.

5. A photopolymerizable composition according to claim 1 wherein said linear acrylic copolymer is produced by reacting (a) a hydroxyl acrylic monomer; (b) a carboxyl acrylic monomer; and (c) an acrylate monomer for forming a linear polymer with the following structure:

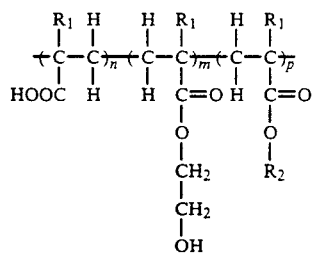

wherein $R_1 = H$, $CH_3$; $R_2 = C_rH_{2r+1}$; $r = 1$ to 18; n, m, and p are integers; and also grafting said linear polymer with unsaturated double bond-containing compounds to form double bond-containing units pendant on said linear polymer.

6. A photopolymerizable composition according to claim 5, wherein the grafting reaction between unsaturated double bond-containing compounds and the linear acrylic polymer is selected from the reactions consisting of (i) substitution reaction between a compound having

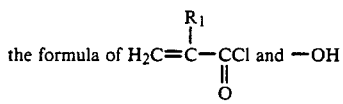

the formula of $H_2C=\overset{R_1}{\underset{}{C}}-\underset{\underset{O}{\|}}{C}-CCl$ and $-OH$ on the linear copolymer;

(ii) condensation reaction between compounds having the formula of

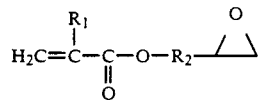

and the $-COOH$ on the linear copolymer;

(iii) condensation reaction between compounds having

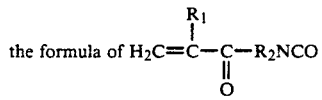

the formula of $H_2C=\overset{R_1}{\underset{}{C}}-\underset{\underset{O}{\|}}{C}-R_2NCO$ and the $-OH$ or $COOH$ on the linear copolymer, wherein $R_1$ is H or $-CH_3$, and $R_2$ is a group involving no grafting reaction, and is selected from the group consisting of alkyl, alkoxy, alicyclic, and aryl groups.

7. A photopolymerizable composition according to claim 6 where the mole number of $-OH$ groups contained in the grafted linear polymer occupy 3–15% of the mole number of the repeated units in the main chain of the grafted polymer and the mole number of $-COOH$ groups occupy 5–40% of the mole number of the repeated units in the main chain.

8. The photopolymerizable composition of claim 7 wherein the amount of the grafted polymer is about 20–80% by weight of said composition.

9. The photopolymerizable composition of claim 8 wherein the amount of the grafted polymer is about 40–60% by weight of said composition.

* * * * *